United States Patent [19]
Humbert et al.

[11] Patent Number: 5,235,492
[45] Date of Patent: Aug. 10, 1993

[54] ELECTROMAGNETIC SHIELDING APPARATUS FOR CELLULAR TELEPHONES

[75] Inventors: Gary A. Humbert, Oakbrook Terrace; Ross P. Goodwin, Chicago, both of Ill.

[73] Assignee: Motorola, Inc., Schaumburg, Ill.

[21] Appl. No.: 853,212

[22] Filed: Mar. 18, 1992

Related U.S. Application Data

[62] Division of Ser. No. 513,721, Apr. 24, 1990, Pat. No. 5,124,889.

[51] Int. Cl.$^5$ .............................................. H05K 9/00
[52] U.S. Cl. .................... 361/818; 174/35 R; 174/51; 174/35 GC; 361/752; 439/108; 439/109; 455/348
[58] Field of Search ............. 174/35 R, 35 MS File, 174/35 TS, 35 GC, 51; 361/424, 399, 415; 439/108, 109; 357/84; 379/58; 455/347, 348

[56] References Cited

U.S. PATENT DOCUMENTS

| | | | |
|---|---|---|---|
| 4,300,016 | 11/1981 | Bergeron et al. | 174/35 R |
| 4,649,461 | 3/1987 | Matsuta | 174/35 R |
| 4,823,235 | 4/1989 | Suzuki et al. | 174/35 R |
| 4,890,199 | 12/1989 | Beutler | 361/424 |
| 5,124,889 | 6/1992 | Humbert et al. | 361/424 |
| 5,150,282 | 9/1992 | Tomura et al. | 361/424 |

FOREIGN PATENT DOCUMENTS

| | | | |
|---|---|---|---|
| 3402714 | 8/1985 | Fed. Rep. of Germany | 174/35 R |
| 3436119 | 4/1986 | Fed. Rep. of Germany | 174/35 R |
| 63-288097 | 11/1988 | Japan | 174/35 R |
| 1324560 | 7/1973 | United Kingdom | 174/35 R |

Primary Examiner—Leo P. Picard
Assistant Examiner—D. Sparks
Attorney, Agent, or Firm—Rolland R. Hackbart

[57] ABSTRACT

Electromagnetic shielding apparatus for portable telephones (300) and other electronic equipment, includes shield clips (100) for intercoupling the conductive surfaces of a housing (302 and 303) to the metal layer (205) of the circuit board (200). Each shield clip (100) mates with a corresponding edge (204) of the circuit board (200) such that tabs (208, 209, 210) insert into holes (108, 109, 110) in the central channel (111—113) of the clip (100) and feet (101, 102, 103) of the clip rest on other tabs (201, 202, 203). The clip (100) is bonded to the metal layer (205) of the circuit board preferably by resistance welding, thereby reliably connecting the clip (100) and the conductive housing surfaces to signal ground.

3 Claims, 3 Drawing Sheets

ELECTROMAGNETIC SHIELDING APPARATUS FOR CELLULAR TELEPHONES

This is a division of application Ser. No. 07/513,721, filed Apr. 24, 1990 now U.S. Pat. No. 5,124,889.

BACKGROUND OF THE INVENTION

The present invention is generally related to radiotelephones, and more particularly to electromagnetic shielding apparatus for cellular telephones.

Cellular telephones and other electronic equipment, such as, for example, computers and microwaves, generate electromagnetic signals which may radiate to and interfere with another portion of that equipment or with another piece of electronic equipment located nearby. To minimize such interference, electrically conducting material in the form of a shield is typically interposed between the source of electromagnetic signals and the circuitry subject to interference. Such shields may take the form of a wall or a complete enclosure placed around the source of electromagnetic signals and/or around the circuitry subject to interference. For example, opposite sides of a circuitry board may be shielded from one another by enclosing each side f the circuit board by a housing portion having a conductive surface, as illustrated, for example, in U.S. Pat. No. 4,890,199. When using such shields, it is very important that the conductive surface of the housing portion be reliable connected to signal ground. For the foregoing reasons, there is a need for electromagnetic shielding apparatus for cellular telephones and other electronic equipment, which reliably shields circuitry therein which is subject to electromagnetic interference from internally and externally generated electromagnetic signals.

OBJECTS OF THE INVENTION

Accordingly, it is an object of the present invention to provide a unique electromagnetic shielding apparatus for cellular telephones and other electronic equipment, which reliably shields circuitry therein which is subject to electromagnetic interference from internally and externally generated electromagnetic signals.

DETAILED DESCRIPTION OF THE PREFERRED EMBODIMENT

Figure 1:
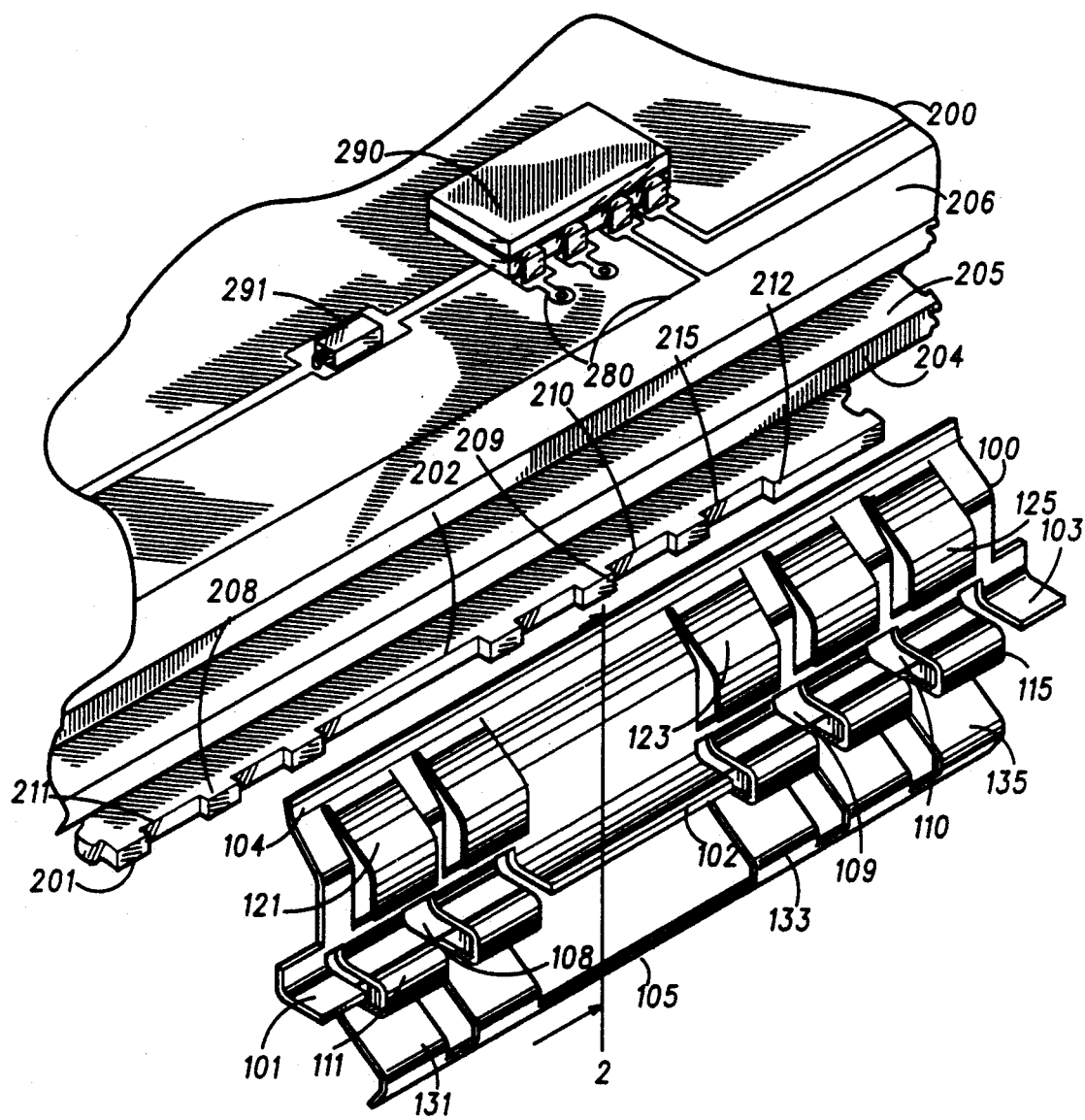
FIG. 1 is an exploded view of spring clip 100 and circuit board section 200, embodying the present invention.

Referring to FIG. 1, there is illustrated an exploded view of spring clip 100 and circuit board section 200, embodying the present invention. Clip 100 includes spring fingers 121-125 and 131-135, feet 101-103, and central channel 111-115. Spring fingers 121-125 each extend from outer edge 104 and have one free end, and spring fingers 131-135 each extend from central channel 111-115 to outer edge 105, being attached on both ends. Central channel includes three holes 108-110.

Circuit board 200 includes a metal layer 205 having an exposed edge 204 (and at least one other exposed edge similar to edge 204 but not shown), electronic circuitry layer 206 with conductive circuitry 280, electronic circuitry layer 207 (see FIG. 2), and electronic components 290 and 291 bonded to electronic circuitry layer 206. Circuit board 200 preferably includes control circuitry on one side (e.g., components 290 and 291 on circuitry layer 206 in FIGS. 1 and 2) and radio frequency circuitry on the other side (e.g., component 292 on circuitry layer 207 in FIG. 2) for use in portable telephone 300 in FIG. 3.

Central channel 111-115 of clip 100 mates with edge 204 (and at least one other clip similar to clip 100, but not shown, mates the other edge similar to edge 204) of circuitry board 200, such that channel portion 111 inserts into notch 211, channel portion 115 inserts into notch 215, foot 101 rests on tab 201, foot 102 rests on tab 202, foot 103 rests on tab 203, tab 208 inserts into hole 108, tab 209 inserts into hole 109, tab 210 inserts into hole 110, etc. Once mated with edge 204, clip 100 may then be attached to metal layer 205 by bonding it to feet 101-103 by welding or any other suitable means. In the preferred embodiment, feet 101-103 of clip 100 are resistance welded to metal layer 205.

Figure 2:
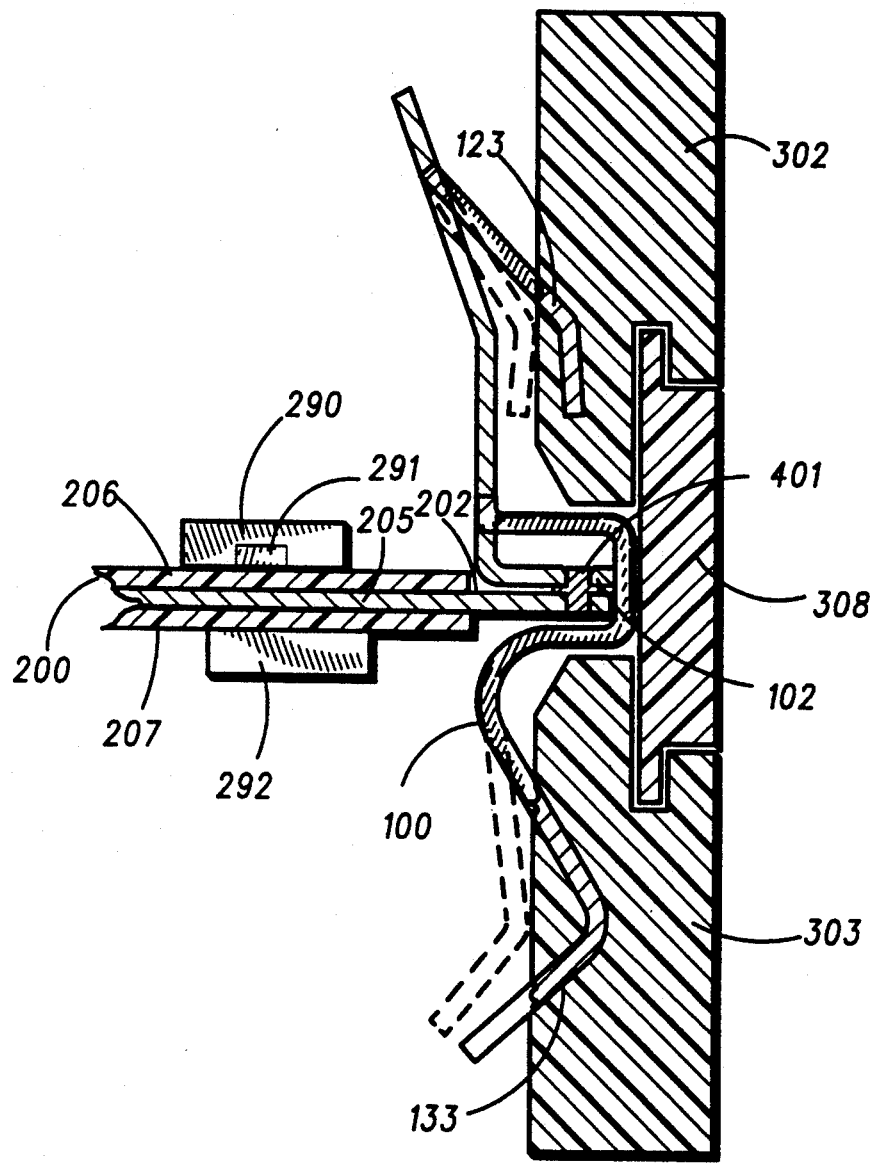
FIG. 2 is a section of the spring clip 100 in FIG. 1 taken along line 2.

Referring next to FIG. 2, there is illustrated a section of the spring clip 100 and circuit board 200 in FIG. 1 taken along line 2. Tab 202 of circuitry board 200 is bonded to foot 102 of clip 100 by weld 401, produced by resistance welding. When top housing portion 302 is mated with bottom housing portion 303, circuit board 200 is held in place and fingers 123 and 133 are pressed (shown by dashed lines) against the conductive inner surfaces of housing portions 302 and 303 for coupling electrical signal ground from metal layer 204 of circuit board 200 to the conductive inner surfaces of housing portions 302 and 303.

Figure 3:
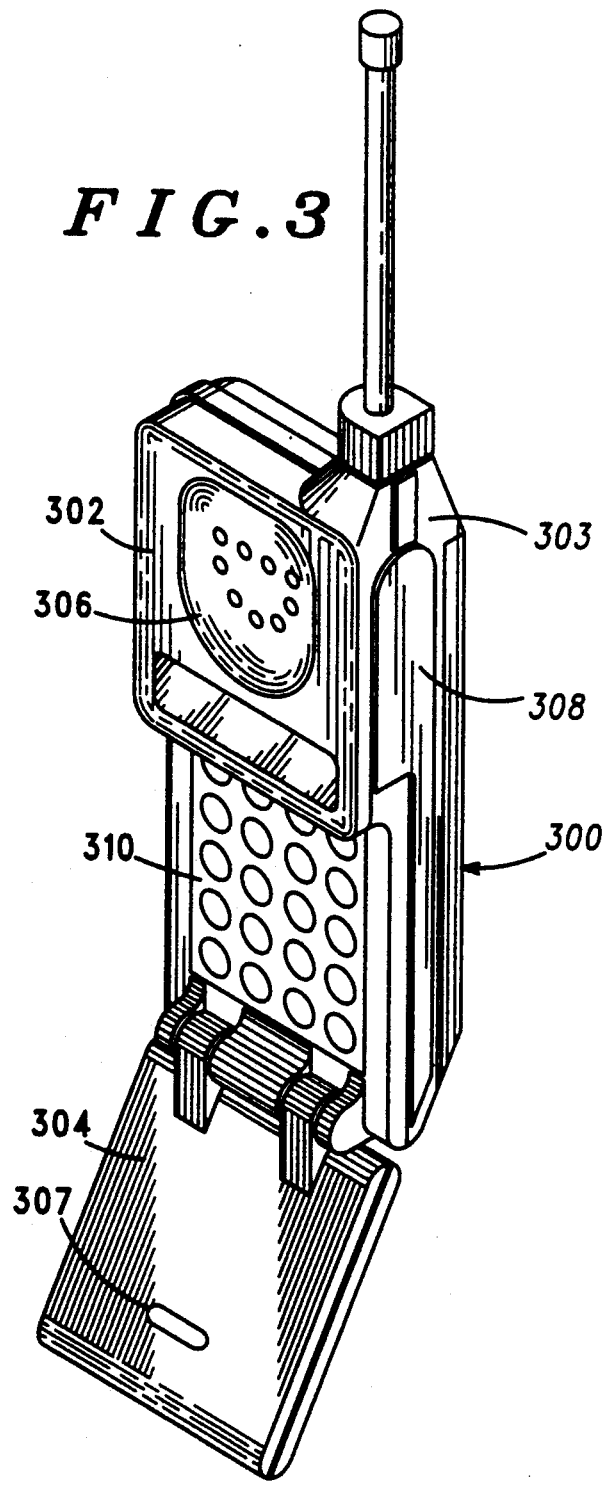
FIG. 3 is a portable telephone 300 including the spring clip 100 and circuit board section 200 illustrated in FIG. 1.

Referring to FIG. 3, portable telephone 300 is, in the preferred embodiment, a cellular portable telephone, which includes a cellular telephone transceiver having a radio transmitter, radio receiver and control unit, such as, for example, the MICROTAC personal telephone marketed and sold by Motorola, Inc., Cellular Subscriber Group, 1475 West Shure Drive, Arlington Heights, Ill. 60004. Portable telephone 300 includes to housing portion 302 which mates with bottom housing portion 303, both of which have conductive inner surfaces which surround circuit board 200. The exposed mating edge of top and bottom housing portions 302 and 303 is covered by element 308. Portable telephone 300 also includes speaker ports 306, keypad 310, and retractable flip 304 with microphone part 307. The structure of portable telephone 300 is described in further detail in U.S. Pat. No. 4,890,199, incorporated herein by reference.

In summary, unique electromagnetic shielding apparatus for portable telephones and other electronic equipment, includes shield clips for intercoupling the conductive housing surfaces to the metal layer of the circuit board. Each shield clip mates with a corresponding edge of the circuit board such that tabs insert into holes in the central channel of the clip and feet of the clip rest on other tabs. The clip is bonded to the metal layer of the circuit board preferably by resistance welding, thereby reliably connecting the clip and the conductive housing surfaces to signal ground.

We claim:

1. A housing having mating top and bottom portions each having conductive inner surfaces for enclosing at least one electronic component, said housing further comprising:

a printed circuit board having an electronic circuitry layer and at least one edge portion with an exposed metallized portion coupled to signal ground, the at least one electronic component bonded to the electronic circuitry layer of the printed circuit board, and the printed circuit board sandwiched between the top and bottom portions of the housing when mated;

at least one clip having first and second sets of spring fingers on opposite sides of a substantially central channel, the at least one edge portion of the printed circuit board inserted into the central channel, such that the exposed metallized portion is contacted by the central channel; and a weld for bonding the central channel to the exposed metallized portion of the printed circuit board, whereby the exposed metallized portion is electrically coupled by the fingers of the at least one clip to the conductive surfaces of the mated top and bottom portions of the housing engaged thereby for electromagnetically shielding the at least one electronic component on the printed circuit board.

2. A method for electromagnetically shielding electronic components bonded to a printed circuit board and enclosed in a housing of a portable radio telephone, the printed circuit board having an electronic circuitry layer and an exposed electronically-grounded metallized portion, the housing having mating top and bottom portions each having conductive inner surfaces for enclosing the electronic components, the method comprising the steps of:

welding at least one clip to the exposed electrically-grounded metallized portion of the at least one edge portion, the at least one clip having first and second sets of spring fingers on opposite sides of a substantially central channel, the at least one edge portion of the printed circuit board inserted into the central channel such that the exposed metallized portion is contacted by the central channel; and mating the top and bottom portions of the housing, whereby the exposed electrically-grounded metallized portion is electrically coupled by the fingers of the at least one clip to the conductive surfaces of the mated top and bottom portions of the housing engaged thereby for electromagnetically shielding the electronic components on the printed circuit board.

3. A portable radio telephone, comprising:

radio transceiver;

a housing having mating top and bottom portions each having conductive inner surfaces for enclosing the radio transceiver;

a telephone keypad disposed in the top portion of the housing;

a printed circuit board having a first surface with a first electronic circuitry layer, a second surface and a second electronic circuitry layer, and at least one edge portion with an exposed metallized portion coupled to signal ground, the printed circuit board sandwiched between the top and bottom portions of the housing when mated;

said radio transceiver including electronic components bonded to the first and second electronic circuitry layers on the printed circuited board;

at least one clip having first and second sets of spring fingers on opposite sides of a substantially central channel, the at least one edge portion of the printed circuit board inserted into the central channel, such that the exposed metallized portion is contacted by the central channel; and a weld for bonding the central channel to the exposed metallized portion of the printed circuit board, whereby the exposed metallized portion is electrically coupled by the fingers of the at least one clip to the conductive surfaces of the mated top and bottom portions of the housing engaged thereby for electromagnetically shielding the electronic components on the printed circuit board.

* * * * *